United States Patent [19]
Hirakata

[11] Patent Number: 5,291,077
[45] Date of Patent: Mar. 1, 1994

[54] SEMICONDUCTOR LOGICAL FET DEVICE

[75] Inventor: Noriyuki Hirakata, Kanagawa, Japan

[73] Assignee: Sumitomo Electric Industries, Ltd., Osaka, Japan

[21] Appl. No.: 955,159

[22] Filed: Oct. 1, 1992

[30] Foreign Application Priority Data

Oct. 2, 1991 [JP] Japan .................. 3-255373

[51] Int. Cl.$^5$ .................. H03K 19/017
[52] U.S. Cl. .................. 307/450; 307/448
[58] Field of Search .................. 307/443, 448, 450

[56] References Cited

U.S. PATENT DOCUMENTS

| | | | |
|---|---|---|---|
| 4,935,647 | 6/1990 | Larkins | 307/450 |
| 4,996,447 | 2/1991 | Tanoi | 307/448 |
| 5,027,007 | 6/1991 | LaRue et al. | 307/448 |
| 5,051,626 | 9/1991 | Katii | 307/450 |
| 5,159,208 | 10/1992 | Kaneko | 307/450 |

FOREIGN PATENT DOCUMENTS 2-179030  7/1990  Japan .
2-303215  12/1990  Japan .

OTHER PUBLICATIONS

D. E. Fulkerson, "Feedback FET Logic: A Robust, High-Speed, Low-Power GaAs Logic Family", IEEE Journal of Solid State Circuit, vol. 26, No. 1, Jan. 1991, pp. 70-74.

Primary Examiner—Edward P. Westin
Assistant Examiner—Andrew Sanders
Attorney, Agent, or Firm—Cushman, Darby & Cushman

[57] ABSTRACT

A semiconductor logical device provides one or a plurality of first field effect transistor(s) which perform a switching operation in accordance with an input signal input to a gate contact thereof, a first element which is constituted by a field effect transistor whose gate and source contacts are subjected to short-circuit, and which is connected as a load of the first field effect transistor, a second element which is constituted by a field effect transistor whose gate and source contacts are subjected to short-circuit and which is connected in series to the first element to act as a load of the first field effect transistor, a source follower circuit for power-amplifying a signal which is generated in the gate-source contact of the first element, and a second field effect transistor whose drain contact is connected to the gate-source contact of the second element, whose source contact is connected to an anode contact of a diode which generates a desired voltage, and to whose gate contact an output signal of the source follower circuit is applied.

6 Claims, 2 Drawing Sheets

SEMICONDUCTOR LOGICAL FET DEVICE

BACKGROUND OF THE INVENTION

1. Field of the Invention

The present invention relates to a semiconductor logical device which is constructed by field effect transistors, and particularly to an improvement in a switching property of a semiconductor logical device.

2. Prior Art

A development of a semiconductor logical device capable of a high speed operation has been recently required, and a semiconductor logical device formed by gallium arsenide metal Schottky junction type field effect transistors (GaAs MES FET) whose base material is gallium arsenide (GaAs) having a high electron mobility is well known (for example, "IEEE JOURNAL OF SOLID STATE CIRCUIT", VOL. 26, NO. 1, JANUARY 1991).

An inverter circuit which is one example of such a semiconductor logical device is shown in FIG. 4.

This inverter circuit is formed by improvement of a circuit named as SBFL (abbreviation of Super Buffer FET Logic), in which an element 4, which acts as a load of a high impedance by shorting between gate-source of a depletion type field effect transistor (hereinafter referred to as D type FET), is connected to an enhancement type field effect transistor 2 (hereinafter referred to as E type FET), a gate contact of an E type FET 6 forming an output circuit which is connected in series between power supply voltage $V_{DD}$ and $V_{SS}$, and a gate contact of E type FET 2 are commonly connected, and a gate contact of the E type FET 8 and a gate contact of the element 4 are commonly connected. Further, in the inverter circuit, a feedback circuit consisting of a D type FET 10 and a Schottky barrier diode 12, which feedback to the gate contact of the E type FET 8 with respect to the change of voltage at the source contact of the E type FET 8 is provided. When an input signal $V_{in}$ is applied to the gate contact of the E type FET 2, an inversion output Q is output to an output terminal 14 which is connected to the source contact of the E type FET 8.

When, in the inverter circuit, the threshold voltage of the D type FET 4 is equalled to that of the D type FET 10 and both gate widths are selected to a suitable value in the design, the logical value "H" of the inversion output Q for the input signal $V_{in}$ of the logical value "L" is clamped to a suitable voltage by the D type FET 10 and unnecessary current which flows into a circuit (not shown) connected to the output terminal 14 is advantageously prevented. Therefore, although the inverter circuit has a large current driving ability at a transition time when the inversion output Q is inverted from the logical value "L" to "H", it has such superior function that the dissipation current can be suppressed to a small value.

However, when the inversion output Q becomes a logical value "L" in the inverter circuit having a feedback circuit shown in FIG. 4, the electric potential of the drain contact of the D type FET 10 becomes low. Thus, the gate-drain internal capacitance $C_{GD}$ which exists between the drain and the gate of the D type FET 10 is increased, with the result that capacitance to be charged by current which flows from the D type FET 4 is increased at a transition time when the inversion output Q is inverted from the logical value "L" to "H" and the delay of the turn-on time necessary for the charge made a problem of hindrance for high speed operation.

SUMMARY OF THE INVENTION

The present invention was made in consideration of the above problem, and an object of the invention is to provide a semiconductor logical device having superior power supply saving and switching properties.

To attain the above object, the semiconductor logical device of the present invention is characterized by providing one or a plurality of first field effect transistor(s) which carry out a switching operation in response to an input signal input to a gate contact, a first element which is formed by a field effect transistor whose gate and source contacts are subjected to short-circuit and connected as a load of said first field effect transistor, a second element which is formed by a field effect transistor whose gate and source contacts are subjected to short-circuit and connected as a load of said field effect transistor by connecting said second element in series to said first element, a source follower circuit which power-amplifies a signal generated in said gate-source contact of said first element, and a second field effect transistor whose drain contact is connected to said gate-source contact of said second element, whose source contact is connected to an anode contact of a diode which generates a desired voltage, and to whose gate contact an output signal of said source follower circuit is applied.

According to the semiconductor logical device thus organized, when the output signal of the source follower circuit becomes a logical value "H", the output signal is clamped by the second field effect transistor in such a manner that it is prevented from becoming high voltage. Accordingly, flow of a current unnecessary for a load circuit which is subordinately connected to the output of the source follower circuit is prevented and power supply saving is realized.

Further, when the output signal of the source follower circuit becomes a logical value "L", the drain contact of the second field effect transistor is maintained to a high voltage and the increase of the gate-drain internal capacitance of the second field effect transistor is restrained. As a result, at a transition time when the output signal of the source follower circuit is inverted from the logical value "L" to "H", the charge of the gate-drain internal capacitance is decreased and the turn-on time becomes short, thereby remarkably improving the switching property.

Thus, the semiconductor logical device of the invention realizes both power supply saving and improvement of the switching property at the same time.

DETAILED DESCRIPTION OF THE PREFERRED EMBODIMENTS

Figure 1:
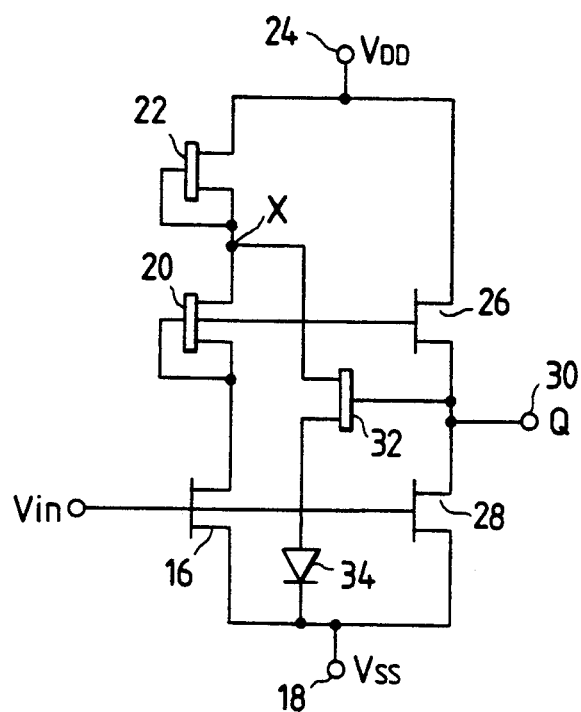
FIG. 1 is a circuit diagram showing a semiconductor logical device according to an embodiment of the present invention.

An embodiment of the present invention will be described with reference to FIG. 1. FIG. 1 shows an inverter circuit which is provided between a power supply voltage $V_{DD}$ and $V_{SS}$ and outputs an inversion output signal Q to an input signal $V_{in}$.

Reference numeral 16 designates an E type FET to whose gate contact the input signal $V_{in}$ is supplied. A source contact of the E type FET 16 is connected to a power supply terminal 18 at the side of a low voltage $V_{SS}$ and a drain contact of the E type FET 16 is connected to a first element 20, which is constituted by a D type FET whose gate and source are subjected to short-circuit to form a high impedance load. Further, the first element 20 is connected to a power supply terminal 24 at the side of a high voltage $V_{DD}$ through a second element 22 which is constituted by a D type FET whose gate and source are subjected to short-circuit to form a high impedance load.

E type FETs 26 and 28 whose respective source and drain terminals are connected between the terminals 24 and 18 form an output circuit. A gate contact of the E type FET 26 is commonly connected to the gate contact of the first element 20 and a gate contact of the E type FET 28 are commonly connected to the gate contact of the E type FET 16. The inversion output signal Q is output to an output terminal 30 which is connected to a source contact of the E type FET 26.

Further, a gate contact of a D type FET 32 is connected to the source contact of the E type FET 26 and a drain contact of the D type FET 32 is connected to a connection contact X of the first and second elements 20 and 22. Additionally, a source contact of the FET 32 is connected to the terminal 18 through a Schottky barrier diode 34 connected with forward bias so as to constitute a feedback circuit which subjects the inversion output signal Q to feedback to the connection contact X.

In this example, a threshold voltage $V_{th}$ of the first element 20 is set to be equal to the threshold voltage $V_{th}$ of the second element 22, and a gate width W1 of the first element 20 and a gate width W2 of the second element 22 are designed with a relationship of $W1 \leq W2$.

The operation of the semiconductor logical device thus organized will now be explained.

First, when the input signal $V_{in}$ of the logical value "L" is applied to the E type FET 16, the E type FETs 16 and 28 are turned off, whereby the voltage of the gate contact of the E type FET 26 increases to a voltage determined by the feedback circuit so that the inversion output signal Q becomes a logical value "H".

Namely, the D type FET 32 detects the logical value "H" of the inversion output signal Q and current flows from the second element 22 to the D type FET 32. As a result, voltage drop is generated in the second element 22 and the gate contact of the E type FET 26 is clamped to a desired voltage so that the inversion output signal Q does not exceed the desired voltage.

Consequently, flow of unnecessary current into a load circuit (not shown) connected to the output terminal 30 is prevented to realize power supply saving.

On the other hand, when the input signal $V_{in}$ of the logical value "H" is input to the E type FET 16, the E type FETs 16 and 28 are turned on so that voltage drop is generated in the first and second elements 20 and 22.

As a result, the gate contact of the E type FET 26 gets closer to the low voltage $V_{SS}$, and further since the E type FET 28 is turned on immediately, the inversion output Q rapidly becomes a logical value "L".

Further, as mentioned above, since the respective threshold voltages $V_{th}$ of the first element 20 and the second element 22 are equally set to each other and the gate width W1 of the first element 20 and the gate width W2 of the second element 22 are designed to satisfy a relationship of $W1 \leq W2$, almost all the voltage drop in both the first element 20 and the second element 22 is generated in the first element 20 and the voltage of the source contact X of the second element 22 is maintained to a high voltage near the voltage $V_{DD}$. As a result, the voltage of the drain contact of the D type FET 32 is also maintained to a high voltage near the voltage $V_{DD}$. Therefore, even though the inversion output signal Q becomes a logical value "L", the drain-gate internal capacitance $C_{GD}$ of the D type FET 32 is not increased.

Therefore, at a transition time when the inversion output signal Q is inverted from the logical value "L" to "H" in accordance with the fact that the input signal $V_{in}$ is inverted from a logical value "H" to "L", the charge of the gate-drain internal capacitance $C_{GD}$ is decreased whereby the turn-on time becomes short and the switching property is remarkably improved.

Next, the semiconductor logical device according to another embodiment of the invention will now be described with reference to FIG. 2. A circuit shown in FIG. 2 is an NOR circuit which outputs NOR operation results C for two input signals A and B.

Figure 2:
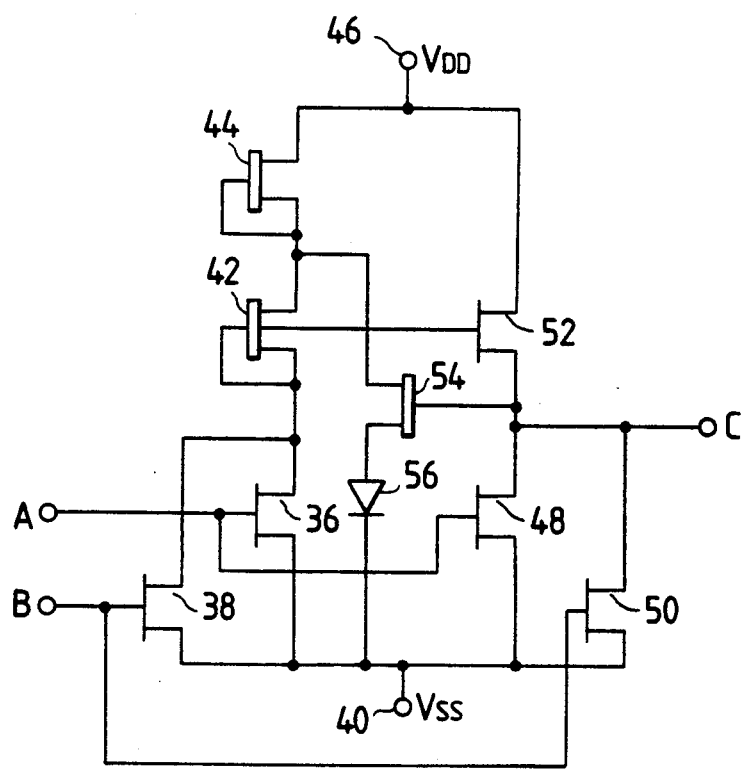
FIG. 2 is a circuit diagram showing a semiconductor logical device according to another embodiment of the present invention.

In FIG. 2, an input signal A is input into a gate contact of one of E type FETs 36 and 38 whose drain contacts and source contacts are commonly connected to one another, respectively, and an input signal B is input into the other gate contact thereof. The common source contacts of these FETs 36 and 38 are connected to a power supply terminal 40 at the side of a low voltage $V_{SS}$ and the common drain contacts thereof are connected to a power supply terminal 46 at the side of a high voltage $V_{DD}$ through a first element 42 and a second element 44 which are mutually connected in series to each other. Both the first and second elements 42 and 44 form a load with high impedance which is constituted by a D type FET whose gate and source are subjected to short-circuit, respectively, as in a case of the elements 20 and 22 shown in FIG. 1. The respective gate width and the threshold voltage are also set in the same relationships as in the latter elements.

Commonly connected source contacts of E type FETs 48 and 50 are connected to the power supply terminal 40, commonly connected drain contacts thereof are connected to a source contact of an E type FET 52 and a gate contact of a D type FET 54, a gate contact of the E type FET 48 is commonly connected to the gate contact of the E type FET 36, and a gate contact of the E type FET 50 is commonly connected to the gate contact of the E type FET 38.

Further, a drain contact of the E type FET 52 is connected to the power supply terminal 46 and a gate contact thereof is connected to a gate contact of the first element 42. A drain contact of the D type FET 54 is connected to a drain contact of the first element 42 and a source contact thereof is connected to the power supply terminal 40 through a Schottky barrier diode 56.

Next, the operation of the semiconductor logical device thus organized will be explained.

As apparent from the circuit arrangement described above, merely when two input signals A and B become a logical value "L" at the same time, the output signal C becomes a logical value "H" and when any one of the two input signals A and B becomes the logical value "H", the output signal C certainly becomes a logical value "L".

Additionally, when the output signal C becomes a logical value "H", voltage drop in the second element 44 is caused by a current which flows into the D type FET 54. Accordingly, the output signal C is clamped to a desired voltage and unnecessary current does not flow into a load circuit (not shown) connected to a post-stage with the result that electric power saving can be carried out.

On the other hand, when the output signal C becomes a logical value L, any one of the E type FETs 36 and 38 is conductive. Accordingly, voltage drop is generated in both the first and second elements 42 and 44 and most all of the voltage drop is generated in the element 42. Consequently, the voltage of the drain contact of the D type FET 54 is maintained to a voltage near a high voltage $V_{DD}$ and a gate-drain internal capacitance $C_{GD}$ of the D type FET 54 is not increased. As a result, the turn-on time at a transition time when the output signal C is inverted from a logical value "L" to "H" becomes short, thereby obtaining an improved switching property.

Figure 3:
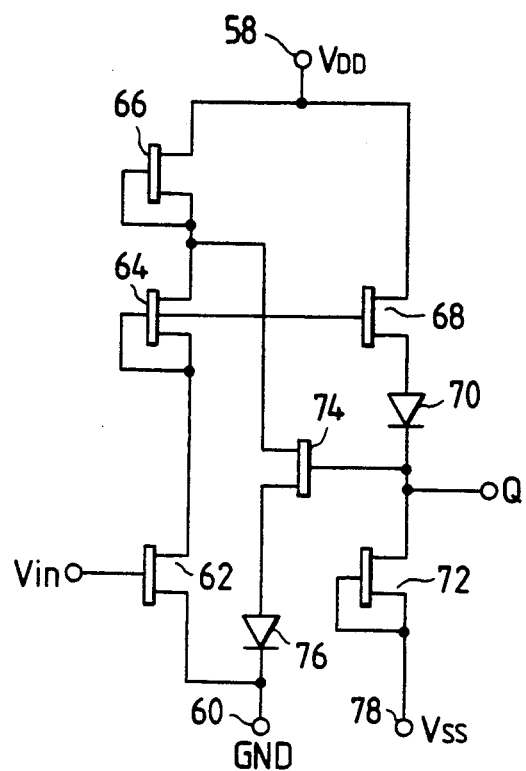
FIG. 3 is a circuit diagram showing a semiconductor logical device according to still another embodiment of the present invention.
Figure 4:
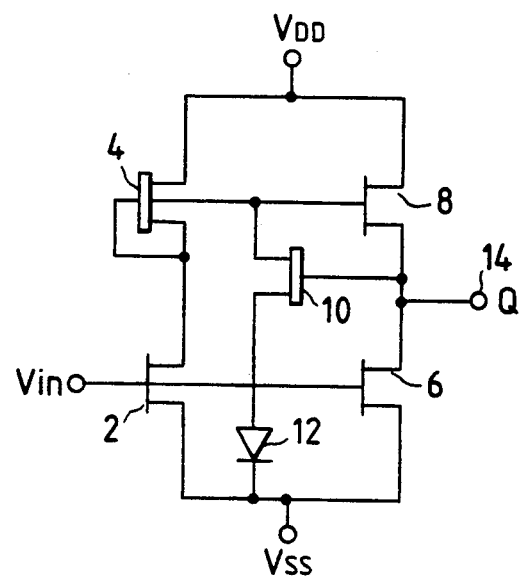
FIG. 4 is a circuit diagram showing a conventional semiconductor device.

Next, the semiconductor logical device according to a still another embodiment of the invention will be explained with reference to FIG. 3. The circuit shown in FIG. 3 is an inverter circuit using the circuit structure of BFL (Buffered FET Logic) and operates at a power supply voltage of a positive (plus) voltage $V_{DD}$ and a negative (minus) voltage $V_{SS}$.

Namely, a D type FET 62, a first and second elements 64 and 66, which form a high impedance load which is constituted by a D type FET whose gate and source are subjected to short-circuit, respectively, are connected in series between a power supply terminal 58 at the side of voltage $V_{DD}$ and a grounded terminal 60. A gate contact of the first element 64 is connected to a source follower circuit which is constituted by a D type FET 68, a level shift diode 70 and a third element 72, which is formed by a D type FET whose gate and source are subjected to shirt-circuit to provide a high impedance load and which is also connected to a power supply terminal 78. Further, in this embodiment, a D type FET 74 and a diode 76 forming the same feedback circuit as shown in FIG. 1 is provided.

Additionally, when an input signal $V_{in}$ is input into the gate contact of the D type FET 62, an inversion output Q is output into the cathode contact of the diode 70.

In this embodiment, the gate contact of the D type FET 68 is clamped to a desired voltage by the feedback circuit structured by the D type FET 74 and the diode 76, whereby when the inversion output signal Q becomes a logical value "H", increase of voltage over a desired value is restrained, resulting in realizing electric power saving. On the other hand, when the inversion output signal Q becomes a logical value "L", the drain contact of the D type FET 74 is maintained to a high voltage to decrease the gate-drain internal capacitance $C_{GD}$ thereof. As a result, the switching property at a time when the logical value of the inversion output signal Q is inverted from "L" to "H" can be improved.

In the above-mentioned three embodiments, a high speed processing is realized by using a GaAs MESFET as a field effect transistor which forms respective circuits. Also, all the field effect transistors used in the above embodiments may be constituted by a Schottky barrier field effect transistor. Further, all the field effect transistors used in the above embodiments may be formed on a gallium arsenide semiconductor substrate in a monolithic structure.

Although description was made to extremely limited embodiments to which the present invention is applied, the present invention is not limited to those embodiments and it can be applied to a semiconductor logical device having other logical structures.

As explained above, according to the semiconductor logical device of the present invention, when the output of the source follower circuit becomes a logical value "H", the output signal is clamped by the threshold voltage of the above-mentioned second field effect transistor so as not to produce high voltage. Therefore, the flow of unnecessary current to a load circuit dependently connected to the source follower circuit is prevented with the result that electric power saving can be realized.

On the other hand, when the output of the source follower circuit becomes "L", the drain contact of the second field effect transistor is maintained to a high voltage and increase in the gate-drain internal capacitance of the second field effect transistor is restrained. Therefore, at a transition time when the output of the source follower circuit is inverted from the logical value "L" to "H", the charge of the gate-drain internal capacitance $C_{GD}$ to be charged is decreased and the turn-on time becomes short thereby remarkably improving the switching property.

As explained above, according to the present invention, the contrary objects of the electric power saving and the improvement of the switching property can be effectively realized at the same time.

What is claimed is:
1. A semiconductor logical device providing:
   at least one first field effect transistor for performing a switching operation according to an input signal input to a gate contact thereof;
   a first element which is formed by a field effect transistor whose gate and source contacts are subjected to short-circuit and acts as a load of said first field effect transistor;
   a second element which is formed by a field effect transistor whose gate and source contacts are subjected to short-circuit, said second element being connected in series to said first element to act as a load of said field effect transistor;
   a source follower circuit for power-amplifying a signal which is generated in said gate-source contact of said first element;
   a diode for generating a desired voltage; and
   a second field effect transistor whose drain contact is connected to said gate and source contacts of said second element, whose source contact is connected to an anode contact of said diode, and to whose gate contact an output signal of said source follower circuit is applied.

2. A semiconductor logical device as claimed in claim 1, wherein said source follower circuit includes a source follower element whose source contact is directly connected to an output terminal.

3. A semiconductor logical device as claimed in claim 1, wherein said source follower circuit includes a level shift element and a source follower element whose source contact is connected to an output terminal through said level shift element.

4. A semiconductor logical device as claimed in claim 1, wherein said first and second elements have equal voltage and a gate width of said first element is narrower than that of said second element.

5. A semiconductor logical device as claimed in claim 1, wherein said first and second field effect transistors and said first and second elements comprises a Schottky barrier field effect transistor.

6. A semiconductor logical device as claimed in claim 1, wherein said first and second field effect transistors and said first and second elements are formed on a gallium arsenide semiconductor substrate in a monolithic structure.

* * * * *